United States Patent
Lu et al.

(10) Patent No.: US 8,957,739 B2
(45) Date of Patent: Feb. 17, 2015

(54) ULTRA-LOW VOLTAGE-CONTROLLED OSCILLATOR WITH TRIFILAR COUPLING

(71) Applicant: Taiwan Semiconductor Manufacturing Co., Ltd., Hsin-Chu (TW)

(72) Inventors: Ying-Ta Lu, Fanlu Township (TW); Hsien-Yuan Liao, Huatan Township (TW); Ho-Hsiang Chen, Hsinchu (TW); Chewn-Pu Jou, Hsinchu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 52 days.

(21) Appl. No.: 13/744,497

(22) Filed: Jan. 18, 2013

(65) Prior Publication Data
US 2014/0203881 A1    Jul. 24, 2014

(51) Int. Cl.
*H03B 5/12*    (2006.01)
*H03B 1/00*    (2006.01)

(52) U.S. Cl.
CPC .............. *H03B 1/00* (2013.01); *H03B 5/1218* (2013.01); *H03B 5/1256* (2013.01); *H03B 2200/0078* (2013.01); *H03B 5/1296* (2013.01); *H03B 5/1228* (2013.01)
USPC .......... 331/117 FE; 331/46; 331/181

(58) Field of Classification Search
CPC .......... H03B 5/08; H03B 5/12; H03B 5/1203; H03B 5/1206; H03B 5/1212; H03B 5/1218; H03B 5/1228; H03B 5/1231; H03B 5/1256; H03B 5/1296; H03B 27/00; H03B 2200/0078
USPC ...... 331/36 L, 46, 50, 52, 56, 117 FE, 117 R, 331/167, 181
See application file for complete search history.

(56) References Cited

U.S. PATENT DOCUMENTS 3,315,178 A * 4/1967 Chernish ....................... 331/114
4,754,236 A * 6/1988 Mamodaly et al. ..... 331/117 FE
(Continued)

OTHER PUBLICATIONS

KaGun Kwok, et al.; "Ultra-Low Voltage High-Performance CMOS VCOs Using Transformer Feedback"; IEEE Journal of Solid-State Circuits, vol. 40, No. 3, Mar. 2005, p. 652-660.
Tai Nghia Nguyen, et al.; "Ultralow-Power Ku-Band Dual-Feedback Armstrong VCO With a Wide Tuning Range"; IEEE Transactions on Circuits and Systems—II: Express Briefs, vol. 59, No. 7, Jul. 2012, p. 394-398.

*Primary Examiner* — Levi Gannon
(74) *Attorney, Agent, or Firm* — Eschweiler & Associates, LLC

(57) ABSTRACT

The present disclosure relates to a device and method to reduce voltage headroom within a voltage-controlled oscillator by utilizing trifilar coupling or transformer feedback with a capacitive coupling technique. In some embodiments of trifilar coupling, a VCO comprises cross-coupled single-ended oscillators, wherein the voltage of first gate within a first single-ended oscillator is separated from the voltage of a second drain within a second single-ended oscillator within the cross-coupled pair. A trifilar coupling network is composed of a drain inductive component, a source inductive component, and a gate inductive component for a single-ended oscillator, wherein a coupling between drain inductive components and gate inductive components between single-ended oscillators along with a negative feedback loop within each single-ended oscillator forms a cross-coupled pair of transistors which reduces the drain-to-source voltage headroom to approximately a saturation voltage of a transistor within the cross-coupled pair. Other devices and methods are also disclosed.

20 Claims, 13 Drawing Sheets

(56) References Cited

U.S. PATENT DOCUMENTS

| | | | |
|---|---|---|---|
| 7,551,038 B2 * | 6/2009 | Jang et al. | 331/45 |
| 7,961,056 B2 * | 6/2011 | Taylor et al. | 331/48 |
| 8,169,269 B2 * | 5/2012 | Bao | 331/117 FE |
| 8,193,868 B2 * | 6/2012 | Trivedi | 331/117 R |
| 2005/0046499 A1 | 3/2005 | Luong et al. | |
| 2006/0181355 A1 * | 8/2006 | Copani et al. | 331/36 L |
| 2009/0072920 A1 * | 3/2009 | Wachi et al. | 331/117 R |
| 2009/0184774 A1 * | 7/2009 | Deng et al. | 331/117 FE |
| 2012/0032746 A1 * | 2/2012 | Bao | 331/117 FE |
| 2013/0147566 A1 * | 6/2013 | Voinigescu et al. | 331/117 FE |

\* cited by examiner

ULTRA-LOW VOLTAGE-CONTROLLED OSCILLATOR WITH TRIFILAR COUPLING

BACKGROUND

Voltage-controlled oscillators (VCO) have applications as precision waveform generators in phase-locked loops (PLLs) and frequency synthesizers. To reduce power consumption within a VCO, a low voltage input is desired without loss of frequency precision of a resultant waveform. Leakage effects reduce efficiency of the supply voltage, increasing the required voltage headroom of the VCO towards the threshold voltage of the individual transistors comprising the VCO.

DETAILED DESCRIPTION

Figure 1A:
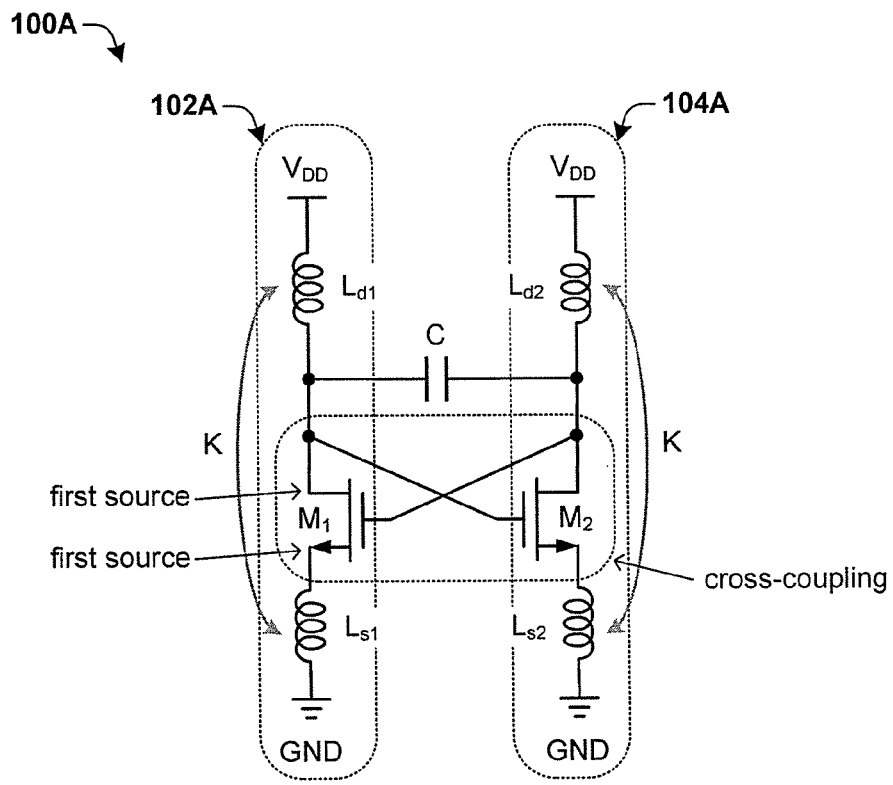
FIG. 1A illustrates a voltage-controlled oscillator (VCO) comprising two cross-coupled single-ended oscillators.

The description herein is made with reference to the drawings, wherein like reference numerals are generally utilized to refer to like elements throughout, and wherein the various structures are not necessarily drawn to scale. In the following description, for purposes of explanation, numerous specific details are set forth in order to facilitate understanding. It may be evident, however, to one of ordinary skill in the art, that one or more aspects described herein may be practiced with a lesser degree of these specific details. In other instances, known structures and devices are shown in block diagram form to facilitate understanding.

FIG. 1A illustrates a voltage-controlled oscillator (VCO) 100A comprising a first single-ended oscillator 102A and a second single-ended oscillator 104A. Operation of the first single-ended oscillator 102A is described herein, wherein operation of the second single-ended oscillator 102B follows analogously. The first single-ended oscillator 102A comprises a first transistor $M_1$, wherein a first drain of the first transistor $M_1$ is connected to a first drain inductor $L_{d1}$, and a first source of the first transistor $M_1$ is connected to a first source inductor $L_{s1}$. The first single-ended oscillator 102A operates by transformer feedback: when a drain voltage at the first drain drops, the source voltage also drops due to magnetic coupling K between $L_{d1}$ and $L_{s1}$. The first transistor $M_1$ turns on and current increases within the first drain. As a result, the drain voltage decreases again, etc, resulting in a positive feedback loop for the first single-ended oscillator 102A. The magnetic coupling K between $L_{d1}$ and $L_{s1}$ results in a same phase for the first drain voltage and the first source voltage.

Figure 1B:
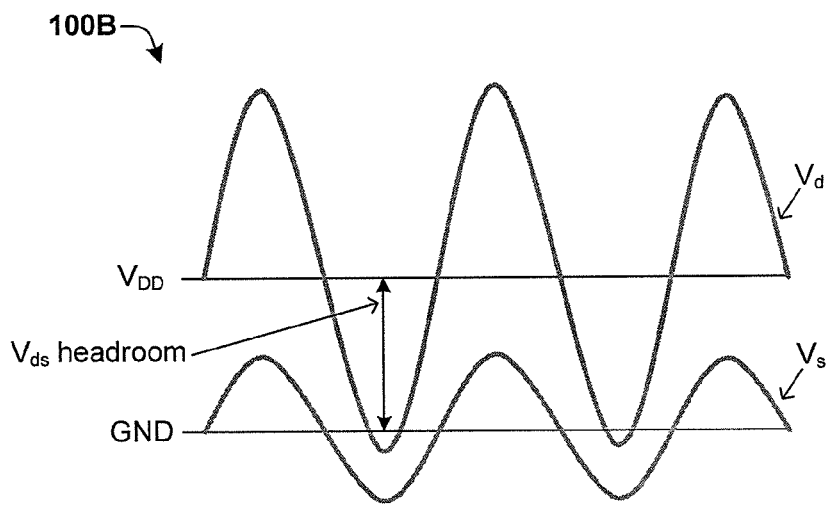
FIG. 1B illustrates a graph of relative voltage headroom for the VCO of FIG. 1A for drain voltage $V_d$ and source voltage $V_s$ waveforms.

The VCO 100A comprises the first single-ended oscillator 102A and the second single-ended oscillator 104A in a cross-coupled configuration, resulting in three positive feedback loops: one each from the first single-ended oscillator 102A and the second single-ended oscillator 104A as described above, and one from the cross-coupling between the first transistor $M_1$ and the second transistor $M_2$. FIG. 1B illustrates a graph 100B of relative voltage headroom for the VCO 100A for drain voltage $V_d$ and source voltage $V_s$ waveforms. The transformer feedback causes a respective drain voltage $V_d$ to swing below the ground potential GND and a respective source voltage $V_s$ to swing above the supply voltage $V_{DD}$, effectively doubling the signal amplitude and reducing a voltage headroom for operation of the VCO 100A. In the absence of transformer feedback the supply voltage $V_{DD}$ is on the order of the threshold voltage of the first transistor $M_1$ and the second transistor $M_2$. Transformer feedback enables dual signal swings across the supply voltage $V_{DD}$ and ground GND and provides suitable oscillation amplitude even at supply voltages below the devices' threshold voltages. However, the voltage headroom of the drain-to-source voltage $V_{ds}$ of the first single-ended oscillator 102A and the second single-ended oscillator 104A is still on the order of the threshold voltage of the first transistor $M_1$ and the second transistor $M_2$.

The following equations describe power consumption of the VCO 100A as a function of supply voltage to illustrate that reduction of the supply voltage reduces power consumption. The first equation defines total power consumption as the summation of leakage effects within the VCO 100A, the leakage effects comprising static power consumption, dynamic power consumption, and leakage power consumption. Dynamic power consumption is shown by the second equation to be proportional to the square of the supply voltage. Static power consumption is shown by equation 3 to be proportional to supply voltage. Leakage power consumption is shown by the fourth equation to be proportional to supply voltage. Thus, reducing the supply voltage reduces power consumption.

$$P_{TOT} = P_{static} + P_{dynamic} + P_{leakage}$$

$$P_{dynamic} = \alpha \times C_{load} \times \text{freq} \times V_{DD}^2$$

$$P_{static} = I_{static} \times V_{DD}$$

$$P_{leakage} = I_{leakage} \times V_{DD}$$

Accordingly, the present disclosure relates to a device and method to reduce voltage headroom within a VCO by utilizing trifilar coupling or transformer feedback with a capacitive coupling technique. In some embodiments of trifilar coupling, a VCO comprises cross-coupled single-ended oscillators, wherein the voltage of first gate within a first single-ended oscillator is separated from the voltage of a second drain within a second single-ended oscillator within the cross-coupled pair. A trifilar coupling network within the VCO is composed of a drain inductive component, a source inductive component, and a gate inductive component for a single-ended oscillator, wherein a coupling between drain inductive components and gate inductive components between single-ended oscillators along with a negative feedback loop within each single-ended oscillator forms a cross-coupled pair of transistors which reduces the $V_{ds}$ voltage headroom to approximately a saturation voltage of a transistor within the cross-coupled pair. Other devices and methods are also disclosed.

Figure 2:
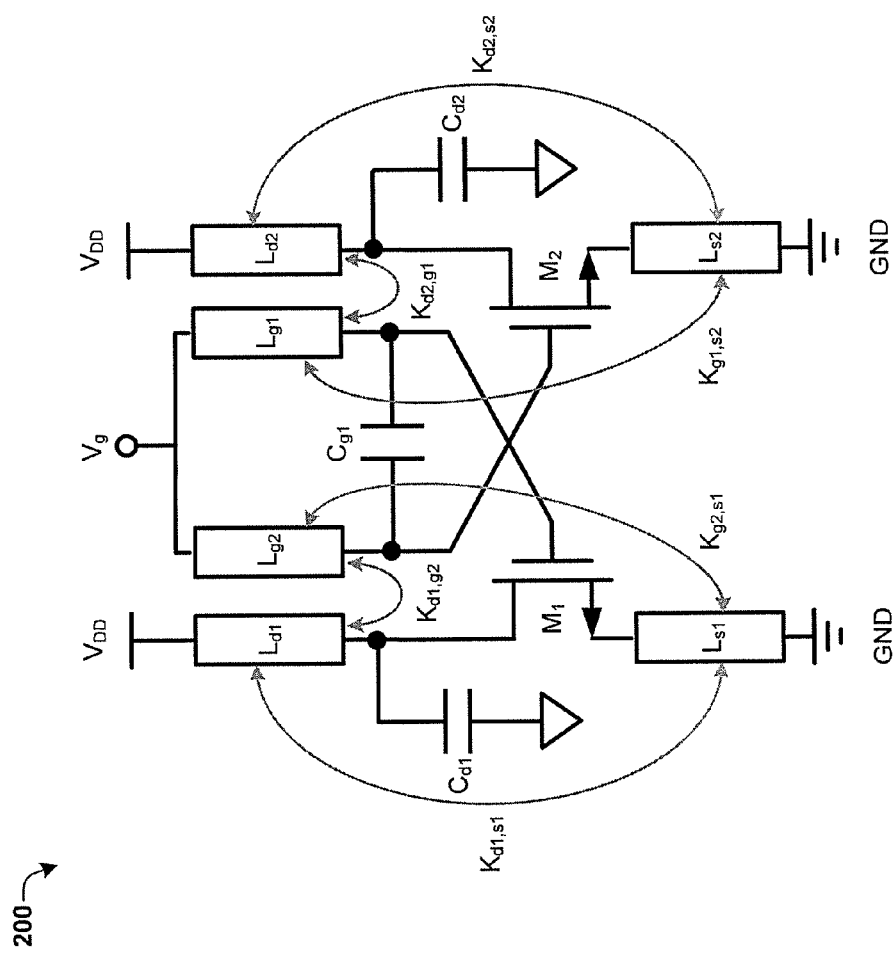
FIG. 2 illustrates some embodiments of a VCO with trifilar coupling between inductive components.

FIG. 2 illustrates some embodiments of a VCO 200 with trifilar coupling between inductive components, comprising a first transistor $M_1$, further comprising a first source connected to a first source inductive component $L_{s1}$, a first drain connected to a first drain inductive component $L_{d1}$, and a first gate connected to a first gate inductive component $L_{g1}$. The VCO 200 further comprises a second transistor $M_2$, further comprising a second source connected to a second source inductive component $L_{s2}$, a second drain connected to a second drain inductive component $L_{d2}$, and a second gate connected to a second gate inductive component $L_{g2}$. The VCO 200 further comprises a first electromagnetic couple $K_{g1,s2}$ between the first gate inductive component $L_{g1}$ and the second source inductive component $L_{s2}$, a second electromagnetic couple $K_{g2,s1}$ between the second gate inductive $L_{g2}$ component and the first source inductive component $L_{s1}$, a third electromagnetic couple $K_{d1,s1}$ between the first drain inductive component $L_{d1}$ and the first source inductive component $L_{s1}$, a fourth electromagnetic couple $K_{d2,s2}$ between the second drain inductive component $L_{d2}$ and the second source inductive component $L_{s2}$, a fifth electromagnetic couple $K_{d1,g2}$ between the first drain inductive component $L_{d1}$ and the second gate inductive component $L_{g2}$, and a sixth electromagnetic couple $K_{d2,g1}$ between the second drain inductive component $L_{d2}$ and the first gate inductive component $L_{g1}$.

The VCO 200 is further configured such that the first drain inductive component $L_{d1}$ is connected to a supply voltage $V_{DD}$, the second drain inductive component $L_{d2}$ is connected to the supply voltage $V_{DD}$, the first gate inductive component $L_{g1}$ is connected to a gate bias voltage $V_g$, the second gate inductive component $L_{g2}$ is connected to the gate bias voltage $V_g$, the first source inductive component $L_{s1}$ is connected to ground GND, and the second source inductive component $L_{s2}$ is connected to ground GND. For an inductive component such as a transformer or inductor the connection is formed to a center tap made to a point halfway along a winding of the transformer or the inductor, or at an edge tap at an edge of the winding.

For the embodiments of VCO 200, the first electromagnetic couple $K_{g1,s2}$, the second electromagnetic couple $K_{g2,s1}$, the third electromagnetic couple $K_{d1,s1}$, and the fourth electromagnetic couple $K_{d2,s2}$ comprise an inverse magnetic couple, whereas the fifth electromagnetic couple $K_{d1,g2}$ and the sixth electromagnetic couple $K_{d2,g1}$ comprise a non-inverting magnetic couple. These couplings result in a cross-coupled transistor pair between the first transistor $M_1$ and the second transistor $M_2$, comprising a first single-ended oscillator further comprising the first transistor $M_1$, the first source inductive component $L_{s1}$, and the first drain inductive component $L_{d1}$, wherein the non-inverting magnetic couple ($K_{d1,g2}$) between the first drain inductive component $L_{d1}$ and the second gate inductive component $L_{g2}$ results in a first negative feedback loop which maintains an opposite voltage phase between the first source inductive component $L_{s1}$ and the first drain inductive component $L_{d1}$. The cross-coupled transistor pair further comprises a second single-ended oscillator comprising the second transistor $M_2$, the second source inductive component $L_{s2}$, and the second drain inductive component $L_{d2}$, wherein the non-inverting magnetic couple ($K_{d2,g1}$) between the second drain inductive component $L_{d2}$ and the first gate inductive component $L_{g1}$ results in a second negative feedback loop which maintains an opposite voltage phase between the second source inductive component $L_{s2}$ and the second drain inductive component $L_{d2}$.

Drain inductive components $L_{d1}$ and $L_{d2}$ and gate inductive components $L_{g1}$ and $L_{g2}$ in conjunction with the non-inverting magnetic fifth electromagnetic couple $K_{d1,g2}$ and the non-inverting magnetic sixth electromagnetic couple $K_{d2,g1}$ provide radio-frequency (RF) signal feedback to sustain oscillation within the VCO 200 while maintaining a direct-current (DC) de-coupling to separate gate and drain node DC biasing individually within a respective single-ended oscillator. Source inductive components of $L_{s1}$ and $L_{s2}$ and gate inductive components $L_{g1}$ and $L_{g2}$ in conjunction with the inverse magnetic first electromagnetic couple $K_{g1,s2}$ and the inverse magnetic second electromagnetic couple $K_{g2,s1}$ provide anti-phase signal feedback between gate and source to achieve transconductance boosting ($g_m$-boosting) for power consumption reduction of the VCO 200. With the separation of bias voltage on the gate of the first transistor $M_1$ and the second transistor $M_2$ from their respective drains, the $V_{ds}$ headroom of the first transistor $M_1$ and the second transistor $M_2$ is lowered to approximately a saturation voltage ($V_{dsat}$) of a respective transistor so that the respective transistor can operate at a sub-threshold voltage. The gate voltage $V_g$ is biased with enough overdrive voltage to meet oscillation criteria so that sub-threshold supply voltage could be achieved.

Figure 3:
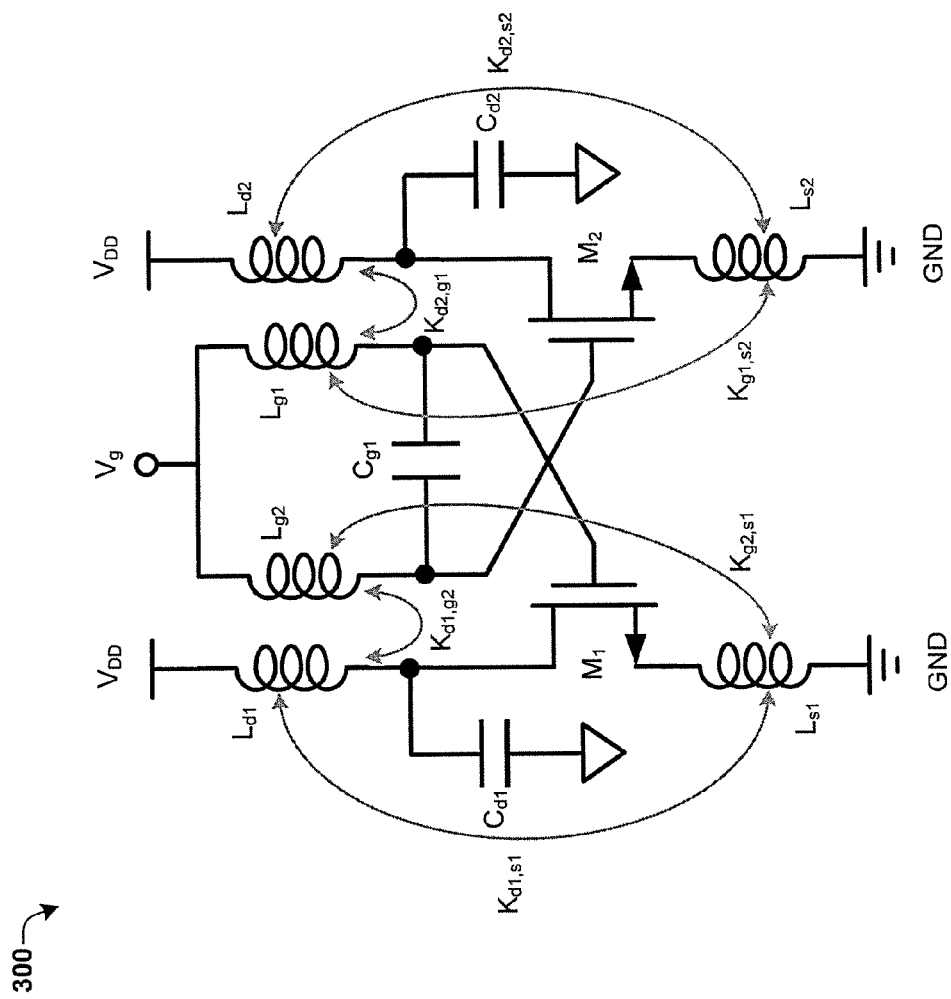
FIG. 3 illustrates some embodiments of a VCO with trifilar coupling between inductive components, an inductive component further comprising an inductor.

In some embodiments, a respective inductive component comprises an inductor, a transformer, a transmission line, or coupled lines wherein the lines comprise one or more metallization layers formed on one or more metallization planes. FIG. 3 illustrates some embodiments of a VCO 300 with trifilar coupling between inductive components, an inductive component further comprising an inductor (i.e., the embodiments of VCO 300 comprise the embodiments of VCO 300 wherein respective inductive components have been replaced by coil inductors).

In contrast to some other approaches, wherein some embodiments of VCOs comprise only two couplings between drain and source nodes and between drain and gate nodes, there is no couple between the gate node and source node of the VCO to reduce voltage headroom and hence power consumption. In some embodiments of VCO 300, the minimum supply voltage $V_{DD}$ in an absence of transformer feedback (i.e., VCO 300 without the third electromagnetic couple $K_{d1,s1}$, and the fourth electromagnetic couple $K_{d2,s2}$) is measured to be approximately 0.6 V, whereas the addition of $K_{d1,s1}$ and $K_{d2,s2}$ further reduce the minimum supply voltage $V_{DD}$ to approximately 0.52 V.

Figure 4:
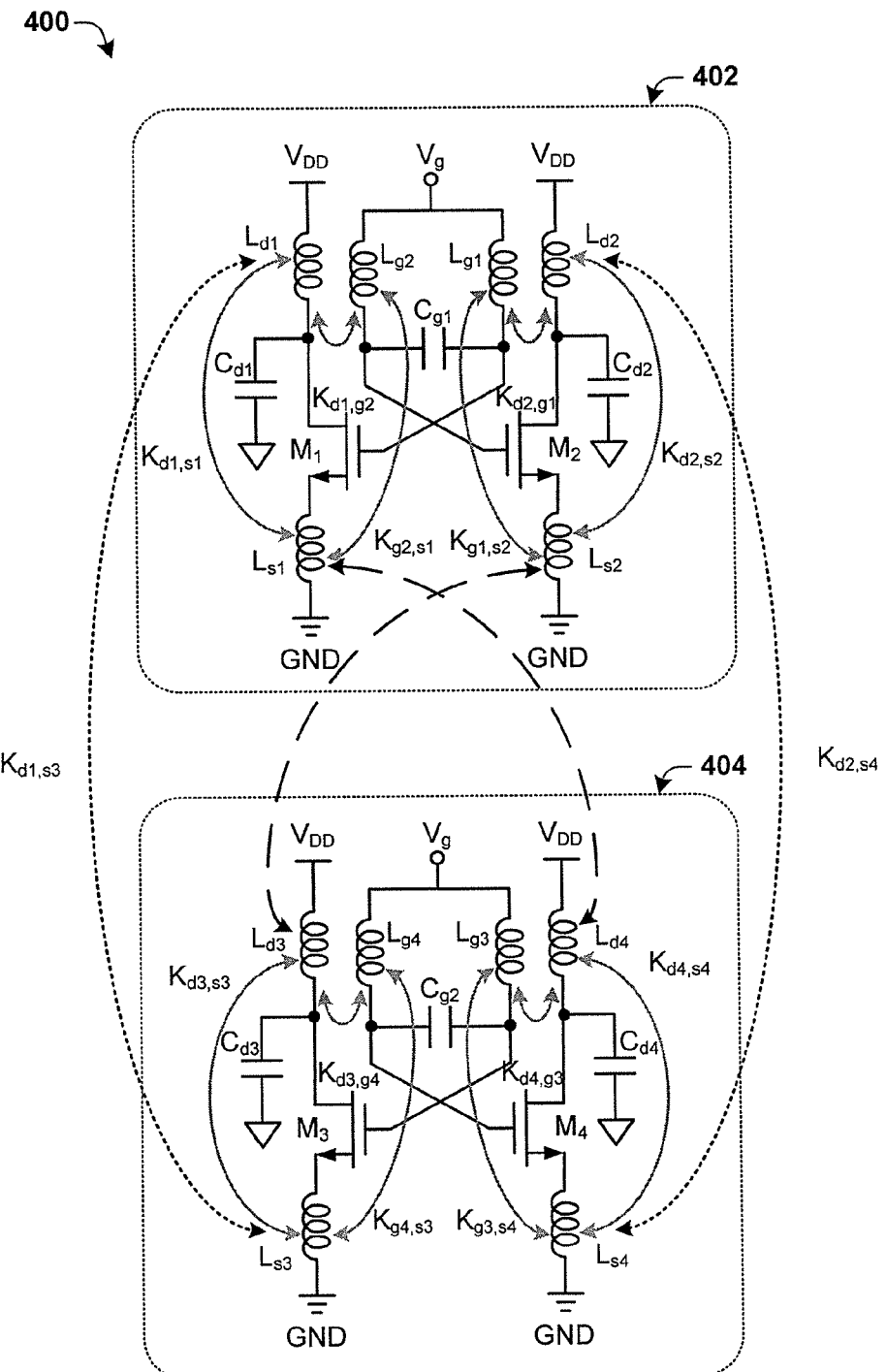
FIG. 4 illustrates some embodiments of a quadrature VCO comprising a first VCO of FIG. 3 and a second VCO of FIG. 3.

The VCO 300 comprises a two-phase VCO. In some embodiments, a 4-phase VCO, or quadrature VCO (QVCO) is derived from the VCO 300, wherein a second VCO of the same type is coupled thereto. FIG. 4 illustrates some embodiments of a QVCO 400 comprising a first VCO 402 and a second VCO 404. A first drain inductive component $L_{d1}$ of the first VCO 402 is electro-magnetically coupled $K_{d1,s3}$ to a third source inductive component $L_{s3}$ of the second VCO 404. Similarly, a second drain inductive component $L_{d2}$ of the first VCO 402 is electro-magnetically coupled $K_{d2,s4}$ to a fourth source inductive component $L_{s4}$ of the second VCO 404. For the embodiments of FIG. 4, the first VCO 402 and the second VCO 404 comprise identical structures. For instance, each pair of $L_{d1}$ and $L_{d3}$, $L_{d2}$ and $L_{d4}$, $L_{s1}$ and $L_{s3}$, and $L_{s2}$ and $L_{s4}$ comprise identical structures and are therefore said to be congruent.

Figure 5:
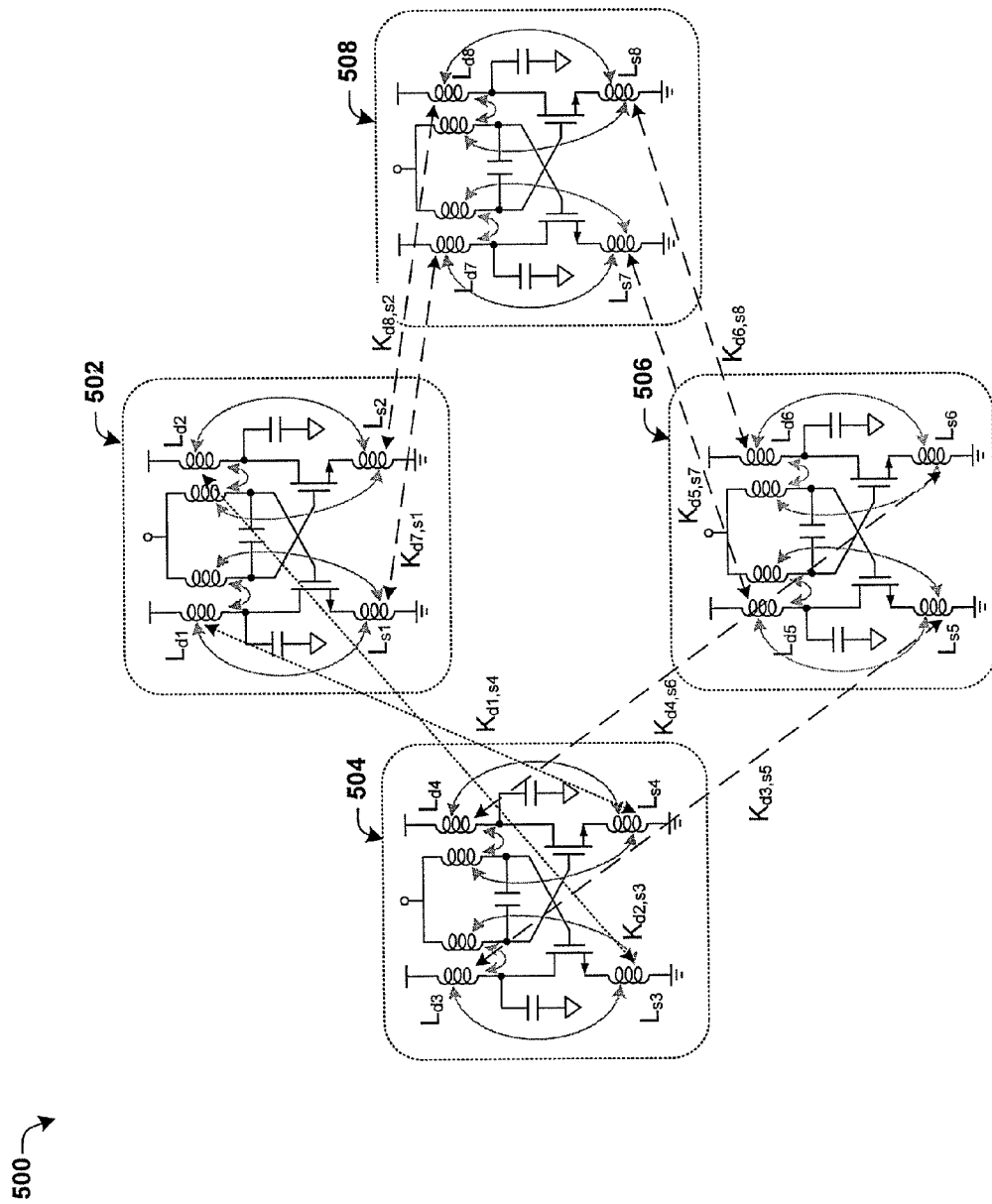
FIG. 5 illustrates some embodiments of an eight-phase VCO comprising a first VCO of FIG. 3, a second VCO of FIG. 3, a third VCO of FIG. 3, and a fourth VCO of FIG. 3.

Similarly, in some embodiments an 8-phase VCO 500 is derived from the VCO 300, wherein a second VCO, a third VCO, and a fourth VCO of the same type are coupled thereto. FIG. 5 illustrates some embodiments of an eight-phase VCO 500 comprising a first VCO 502, a second VCO 504, a third VCO 506, and a fourth VCO 508. The 8-phase VCO 500 comprises a first drain inductive component $L_{d1}$ of the first VCO 502 electro-magnetically coupled $K_{d1,s4}$ to a fourth source inductive component $L_{S4}$ of the second VCO 504, wherein the fourth source inductive component $L_{s4}$ of the second VCO 504 is said to be congruent with the second source inductive component $L_{s2}$ of the first VCO 502 (i.e., the first VCO 502 and the second VCO 504 are identical, as such the $L_{s2}$ and $L_{s4}$ are identical, said to be congruent). In addition, source or drain inductive components within similarly-configured single-ended oscillators (i.e., the left or right single-ended oscillator within a respective VCO) are also said to be congruent. A second drain inductive component $L_{d2}$ of the first VCO 502 is electro-magnetically coupled $K_{d2,s3}$ to a third source inductive component $L_{s3}$ of the second VCO 504. A third drain inductive component $L_{d3}$ of the second VCO 504 is electro-magnetically coupled $K_{d3,s5}$ to a fifth source inductive component $L_{s5}$ of the third VCO 506. A fourth drain inductive component $L_{d4}$ of the second VCO 504 is electro-magnetically coupled $K_{d4,s6}$ to a sixth source inductive component $L_{s6}$ of the third VCO 506. A fifth drain inductive component $L_{d5}$ of the third VCO 506 is electro-magnetically coupled $K_{d5,s7}$ to a seventh source inductive component $L_{s7}$ of the fourth VCO 508. A sixth drain inductive component $L_{d6}$ of the third VCO 506 is electro-magnetically coupled $K_{d6,s8}$ to an eighth source inductive component $L_{s8}$ of the fourth VCO 508. A seventh drain inductive component $L_{d7}$ of the VCO 508 is electro-magnetically coupled $K_{d7,s1}$ to a first source inductive component $L_{s1}$ of the first VCO 502. And, an eighth drain inductive component $L_{d8}$ of the fourth VCO 508 is electro-magnetically coupled $K_{d8,s2}$ to a second source inductive component $L_{s2}$ of the first VCO 502.

In general, a VCO comprising eight or more phases, (e.g., 8, 16, 32, etc.), hereto referred to as a multi-phase VCO, may be derived from VCO 300, wherein three or more VCOs of the same type are coupled thereto. The couplings between a first VCO (502) and second VCO (504) of the multi-phase VCO comprise electromagnetic couplings $K_{d1,s4}$ and $K_{d2,s3}$ as in the embodiments of FIG. 5. Subsequent couplings of additional VCOs comprise electromagnetic couplings between congruent source inductive components of an $n^{th}$ additional VCO to congruent drain inductive components of an $(n-1)^{th}$ VCO (e.g., coupling of the third VCO 506 to the second VCO 504 in the embodiments of FIG. 5). In this manner, congruent components are defined as follows: The $n^{th}$ additional VCO comprises a $(2n-1)^{th}$ drain inductive component $L_{d(2n-1)}$ and a $2n^{th}$ drain inductive component $L_{d2n}$, as well as a $(2n-1)^{th}$ source inductive component $L_{s(2n-1)}$ and a $2n^{th}$ source inductive component $L_{s2n}$. The $(2n-1)^{th}$ source inductive component $L_{s(2n-1)}$ of the $n^{th}$ additional VCO is electromagnetically coupled $K_{dn,s(2n-1)}$ to the $n^{th}$ drain inductive component $L_{dn}$ of the $(n-1)^{th}$ VCO. Similarly, the $2n^{th}$ source inductive component $L_{s2n}$ of the $n^{th}$ additional VCO is electromagnetically coupled $K_{d(n+1),s2n}$ to the $(n+1)^{th}$ drain inductive component $L_{d(n+1)}$ of the $(n-1)^{th}$ VCO. For a 2n-phase multi-phase VCO, the $(2n-1)^{th}$ drain inductive component $L_{d(2n-1)}$ is electro-magnetically coupled $K_{d(2n-1),s1}$ to the first source inductive component $L_{s1}$ of the first VCO, and the $2n^{th}$ drain inductive component $L_{d2n}$ is electromagnetically coupled $K_{d2n,s2}$ to the second source inductive component $L_{s2}$ of the first VCO. For a multi-phase VCO comprising greater than 2n-phases, the $(2n-1)^{th}$ drain inductive component $L_{d(2n-1)}$ is electromagnetically coupled $K_{d(2n-1),s(2n+1)}$ to a $(2n+1)^{th}$ source inductive component $L_{s(2n+1)}$ of an $(n+1)^{th}$ additional VCO, and the $2n^{th}$ drain inductive component $L_{d2n}$ is electromagnetically coupled $K_{d2n,s(2n+2)}$ to a $(2n+2)^{th}$ source inductive component $L_{s(2n+2)}$ of the $(n+1)^{th}$ additional VCO.

Figure 6:
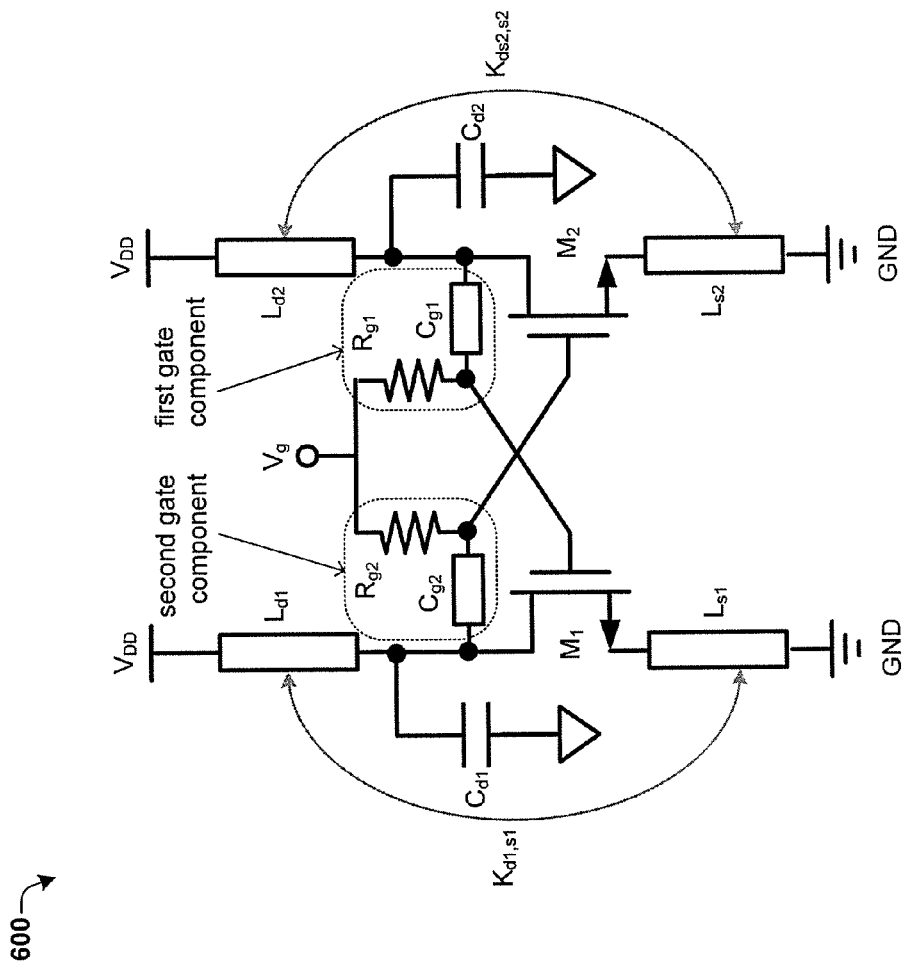
FIG. 6 illustrates some embodiments of a VCO with transformer feedback and capacitive coupling.

FIG. 6 illustrates some embodiments of a VCO 600 with transformer feedback and capacitive coupling, comprising a first transistor $M_1$, further comprising a first source connected to a first source inductive component $L_{s1}$, a first drain connected to a first drain inductive component $L_{d1}$, and a first gate connected to a first gate component. The VCO 600 further comprises a second transistor $M_2$, further comprising a second source connected to a second source inductive component $L_{s2}$, a second drain connected to a second drain inductive component $L_{d2}$, and a second gate connected to a second gate component. The first gate component comprises a first capacitive component $C_{g1}$ configured in series with a first resistive component $R_{g1}$, wherein the first resistive component $R_{g1}$ is connected to a gate bias voltage $V_g$ and the first capacitive component $C_{g1}$ is connected to the second drain. The first gate is connected between the first resistive component $R_{g1}$ and the first capacitive component $C_{g1}$. Similarly, the second gate component comprises a second capacitive component $C_{g2}$ configured in series with a second resistive component $R_{g2}$, wherein the second resistive component $R_{g2}$ is connected to the gate bias voltage $V_g$ and the second capacitive component $C_{g2}$ is connected to the first drain. The second gate is connected between the second resistive component $R_{g2}$ and the second capacitive component. In some embodiments, a connection comprises a connection to a center tap made to a point halfway along an element of a capacitive component or a resistive component.

The VCO 600 is further configured such that the first drain inductive component $L_{d1}$ is connected to a supply voltage $V_{DD}$, the second drain inductive component $L_{d2}$ is connected to the supply voltage $V_{DD}$, the first source inductive component $L_{s1}$ is connected to ground GND, and the second source inductive component $L_{s2}$ is connected to ground GND. For an inductive component comprising an inductor, a transformer, a transmission line, or coupled lines, the connection is formed to a center tap made to a point halfway along a winding of the transformer or the inductor, or at an edge tap at an edge of the winding.

For the embodiments of VCO 600, a first inverted magnetic couple $K_{d1,s1}$ is formed between the first drain inductive component $L_{d1}$ and the first source inductive component $L_{s1}$, and a second inverted magnetic couple $K_{d2,s2}$ is formed between the second drain inductive component $L_{d2}$ and the second source inductive component $L_{s2}$. The first inverted magnetic couple $K_{d1,s1}$ results in transformer feedback between the first drain inductive component $L_{d1}$ and the first source inductive component $L_{s1}$. Likewise, the second inverted magnetic couple $K_{d2,s2}$ results in transformer feedback between the second drain inductive component $L_{d2}$ and the second source inductive component $L_{s2}$. The first inverted magnetic couple $K_{d1,s1}$ and the second inverted magnetic couple $K_{d2,s2}$ results from proximity between the first drain inductive component $L_{d1}$ and the first source inductive component $L_{s1}$, and from proximity between the second drain inductive component $L_{d2}$ and the second source inductive component $L_{s2}$, respectively.

Proximity between two or more inductive components such as inductors, transformers, transmission lines, coupled metallization lines, or combinations thereof creates a mutual inductance between the two or more inductive components wherein a change in current in a first inductive component induces a voltage (i.e., electromotive force, or EMF) in a second inductive component as dictated by Oersted's law and Faraday's law of induction.

The embodiments of VCO 600 further comprise a cross-coupled transistor pair between the first transistor $M_1$ and the second transistor $M_2$, comprising a first capacitive coupling between the first drain and the second gate resulting from the second capacitive component $C_{g2}$, and a second capacitive coupling between the second drain and the first gate resulting from the first capacitive component $C_{g2}$, wherein a respective capacitive component comprises a capacitor or coupled lines. With the signal coupled by the first and second respective capacitive components, $C_{g1}$ and $C_{g2}$, and with the signal blocked by the first and second respective resistive components, $R_{g1}$ and $R_{g2}$, oscillation can be maintained and a DC de-coupling separates gate and drain node for DC biasing individually within the VCO 600. In some embodiments, resistive components $R_{g1}$ and $R_{g2}$ comprise resistors or transmission lines.

With the separation of bias voltage on the first transistor $M_1$ and the second transistor $M_2$ gate nodes and drain nodes, $V_{ds}$ headroom of the first transistor $M_1$ and the second transistor $M_2$ can lower to approximately a saturation voltage ($V_{dsat}$) of a respective transistor so that can the respective transistor can operate at a sub-threshold voltage. With the capacitor couple signal between gate and drain nodes of the first transistor $M_1$ and the second transistor $M_2$, a negative feedback loop is generated to form a cross-coupled pair with the first transistor $M_1$ and the second transistor $M_2$ in the RF signal path. As a result, the gate voltage $V_g$ is biased with enough overdrive voltage to meet oscillation criteria so that sub-threshold supply voltage could be achieved.

Figure 7:
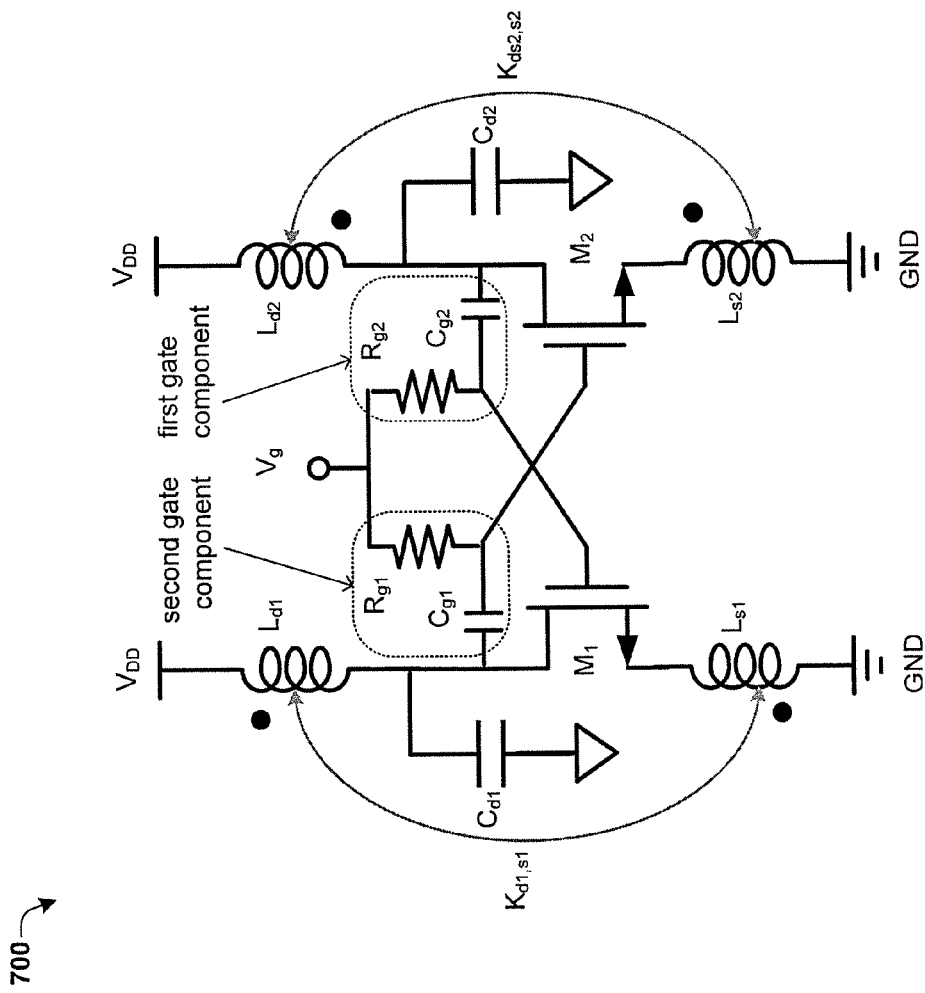
FIG. 7 illustrates some embodiments of a VCO with transformer feedback between inductive components, capacitive coupling across capacitive components, and signal blocking by resistive components.

FIG. 7 illustrates some embodiments of a VCO 700 with transformer feedback ($K_{d1,s1}$ and $K_{d2,s2}$) between inductive components ($L_{d1}$ and $L_{s1}$ and $L_{d2}$ and $L_{s2}$, respectively) and capacitive coupling across capacitive components $C_{g1}$ and $C_{g2}$ comprising capacitors, and signal blocking by resistive components $R_{g1}$ and $R_{g2}$ comprising resistors.

Figure 8:
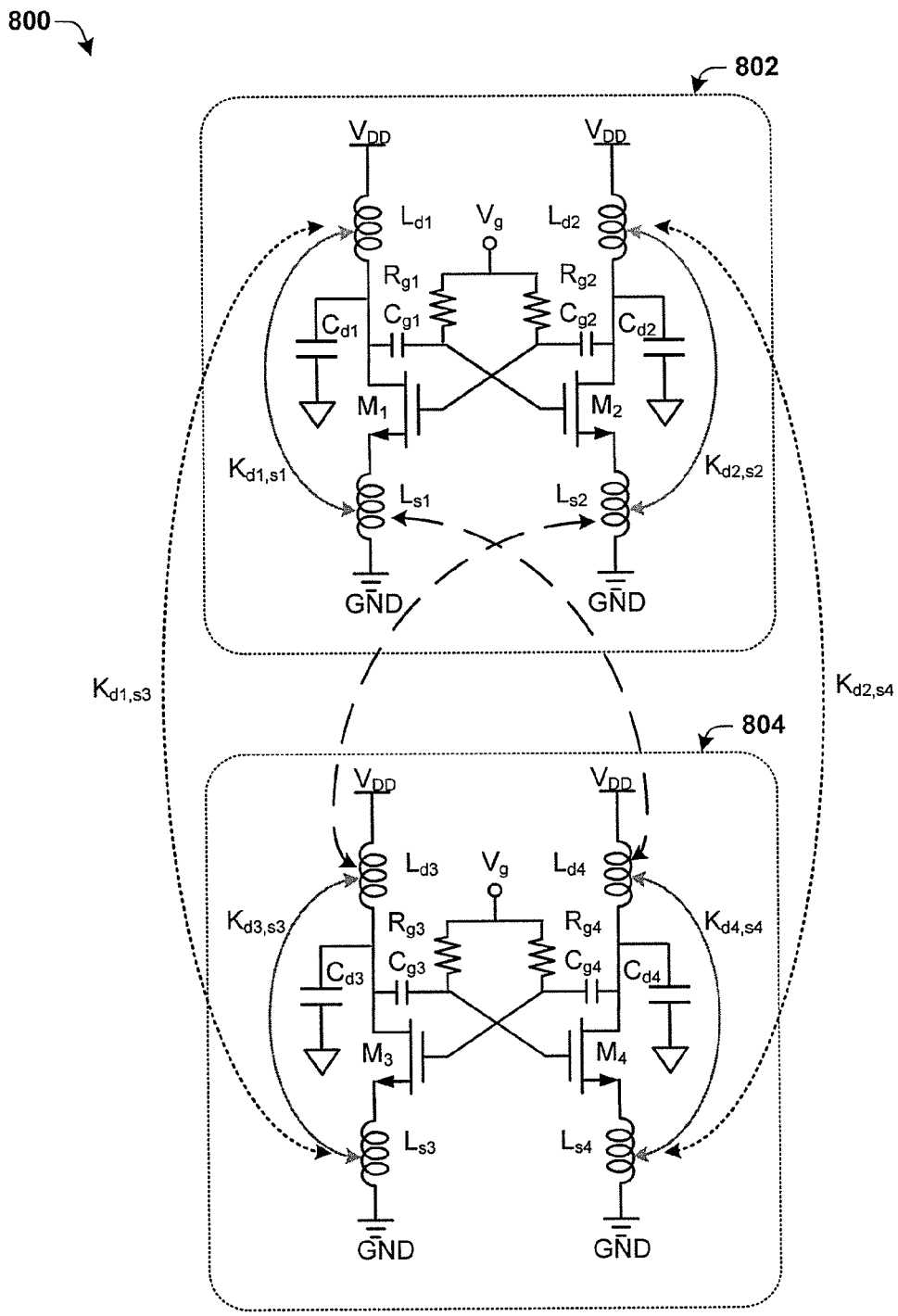
FIG. 8 illustrates some embodiments of a quadrature VCO comprising a first VCO of FIG. 7 and a second VCO of FIG. 7.

FIG. 8 illustrates some embodiments of a QVCO 800 comprising a first VCO 802 and a second VCO 804, wherein a respective VCO further comprises the VCO of the embodiments of FIG. 7, and wherein the first VCO 802 and the second VCO 804 are coupled in a manner in accordance with the embodiments of FIG. 4.

Figure 9:
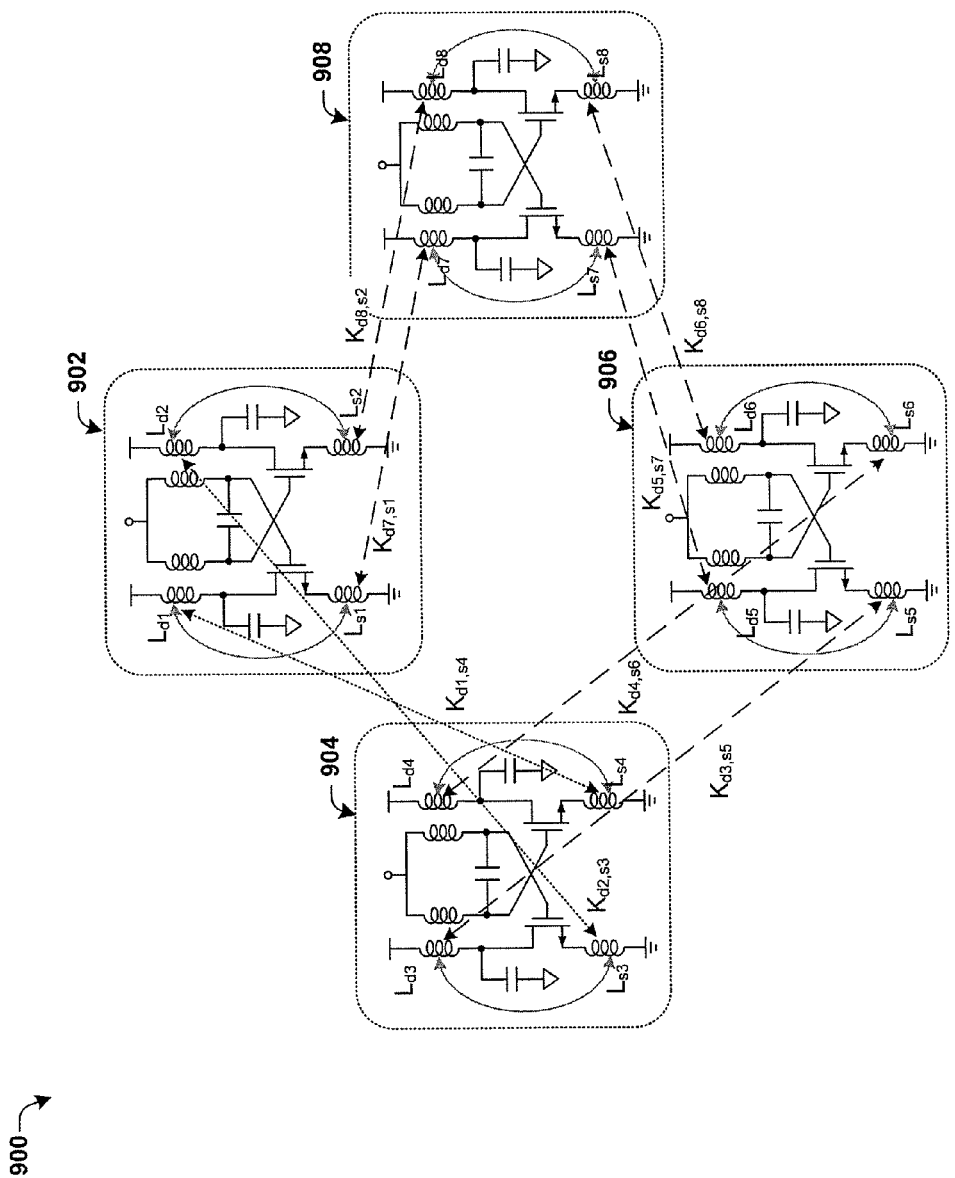
FIG. 9 illustrates some embodiments of an eight-phase VCO comprising a first VCO of FIG. 7, a second VCO of FIG. 7, a third VCO of FIG. 7, and a fourth VCO of FIG. 7.

Similarly, FIG. 9 illustrates some embodiments of an eight-phase VCO 900 comprising a first VCO 902, a second VCO 904, a third VCO 906, and a fourth VCO 908, wherein a respective VCO further comprises the VCO of the embodiments of FIG. 7, and wherein the first VCO 902, the second VCO 904, the third VCO 906, and the fourth VCO 908 are coupled in a manner in accordance with the embodiments of FIG. 5.

Figure 10A:
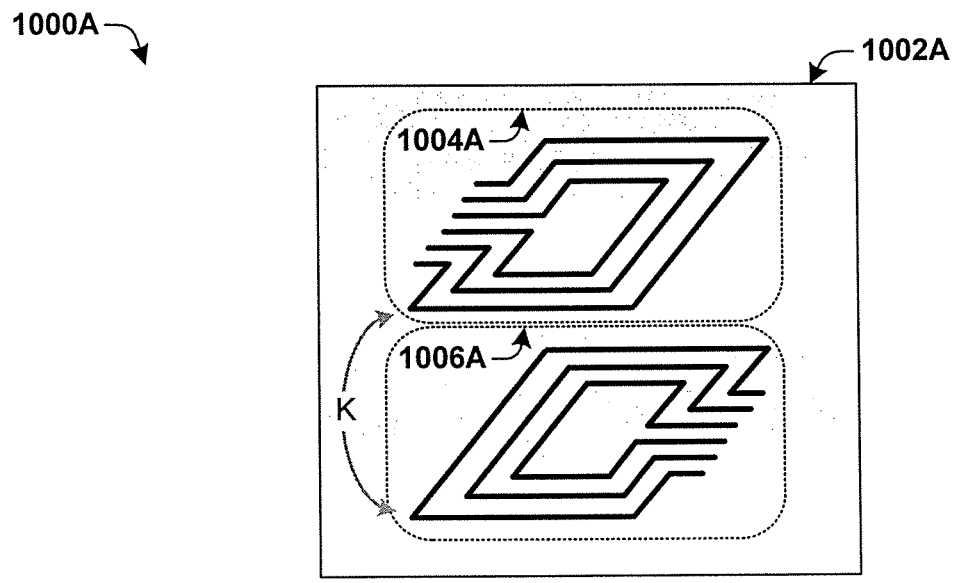
FIG. 10A illustrates some embodiments of VCO coupling through stacking within an integrated circuit (IC) layout.
Figure 10B:
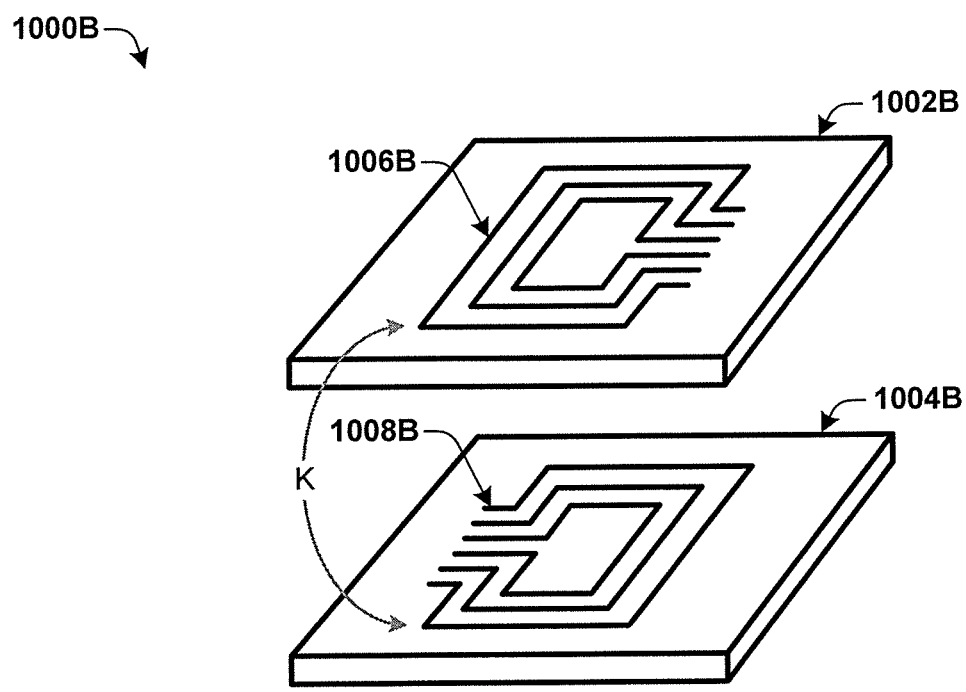
FIG. 10B illustrates some embodiments of VCO coupling through stacking between two layouts within a 3-dimensional (3D) IC.
Figure 10C:
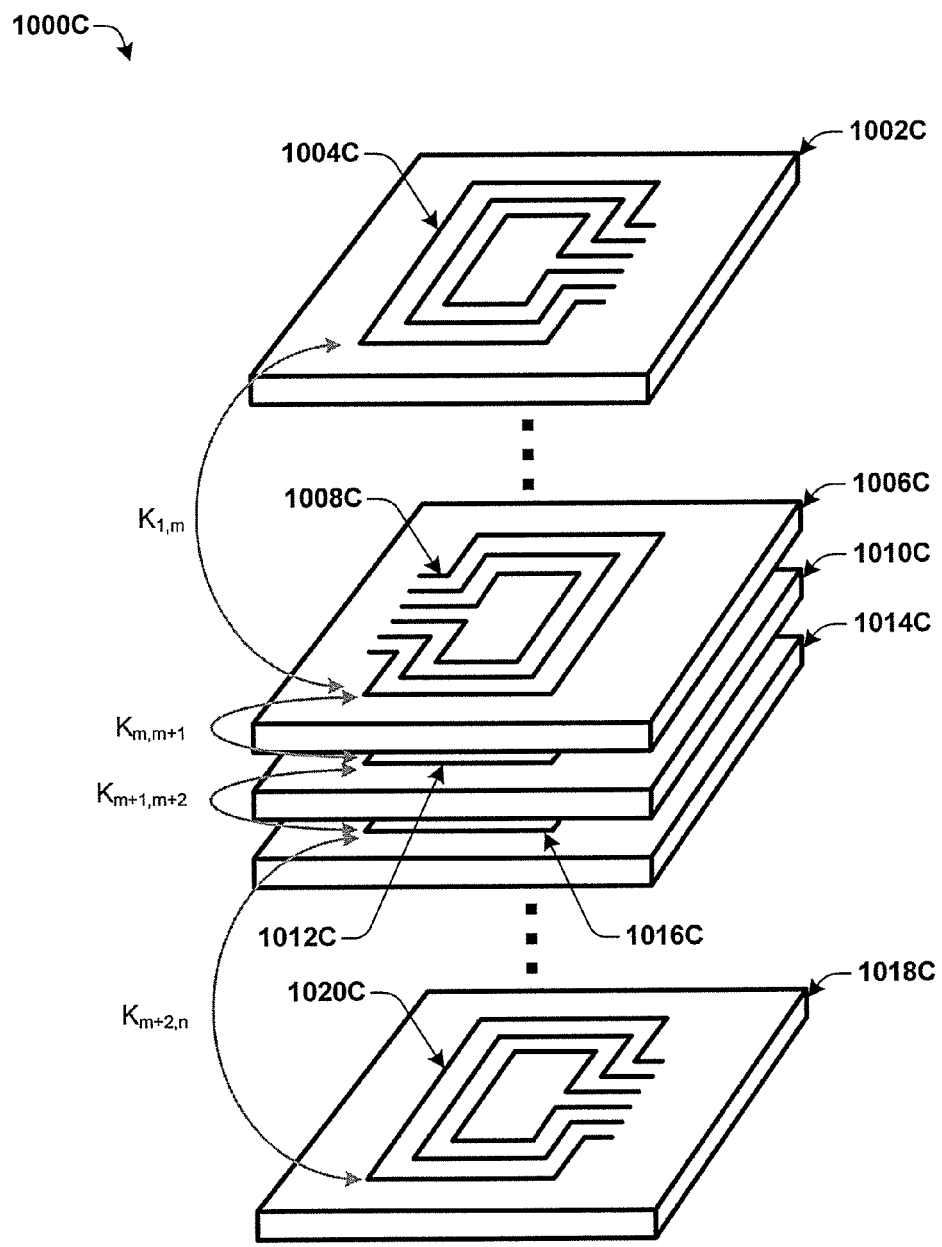
FIG. 10C illustrates some embodiments of VCO coupling through stacking multiple layouts within a 3-dimensional (3D) IC.

FIG. 10A-10C illustrate some embodiments of VCO coupling 1000A though stacking within an integrated circuit (IC) layout, and stacking between two or more layouts within a 3-dimensional (3D) IC. FIG. 10A illustrates some embodiments of VCO coupling through stacking within an integrated circuit (IC) layout 1002A, wherein a first inductor 1004A and a second inductor 1006A are magnetically coupled K, thus resulting in a mutual inductance due to proximity. A respective inductor comprises coiled metallization layers formed on one or more metallization planes. FIG. 10B illustrates some embodiments of VCO coupling 1000B through stacking between two layouts within a 3-dimensional (3D) IC. A first VCO chip 1002B and a second VCO chip 1004B comprise a first inductor 1006B and a second inductor 1008B respectively, which are magnetically coupled K thus resulting in a mutual inductance due to proximity between the first VCO chip 1002B and the second VCO chip 1004B within the 3D IC. FIG. 10C illustrates some embodiments of VCO coupling 1000C though stacking multiple layouts within a 3D IC, the 3D IC comprising a first VCO chip 1002C comprising a first inductor 1004C, an $m^{th}$ VCO chip 1006C comprising an $m^{th}$ inductor 1008C, an $(m+1)^{th}$ VCO chip 1010C comprising an $(m+1)^{th}$ inductor 1012C, an $(m+2)^{th}$ VCO chip 1014C comprising an $(m+2)^{th}$ inductor 1016C, and an $n^{th}$ VCO chip 1018C comprising an $n^{th}$ inductor 1020C. Magnetic couplings resulting in a mutual inductance experienced between adjacent pairs of conductors are shown: a first magnetic coupling $K_{1,m}$ between the first inductor 1004C and the $m^{th}$ inductor 1008C, a second magnetic coupling $K_{m,m+1}$ between the $m^{th}$ inductor 1008C and the $(m+1)^{th}$ inductor 1012C, a third magnetic coupling $K_{m+1,m+2}$ between the $(m+1)^{th}$ inductor 1012C and the $(m+2)^{th}$ inductor 1016C, and a fourth magnetic coupling $K_{m+2,n}$ between the $(m+2)^{th}$ inductor 1016C and the $n^{th}$ inductor 1020C. In addition to a self inductance experienced within each respective inductor, there is a pairwise coupling between all combination of the first inductor 1004C, the $m^{th}$ inductor 1008C, the $(m+1)^{th}$ inductor 1012C, the $(m+2)^{th}$ inductor 1016C, and the $n^{th}$ inductor 1020C (i.e., $K_{1,m+1}$, $K_{1,m+2}$, $K_{1,n}$, etc. . . . ).

Figure 11:
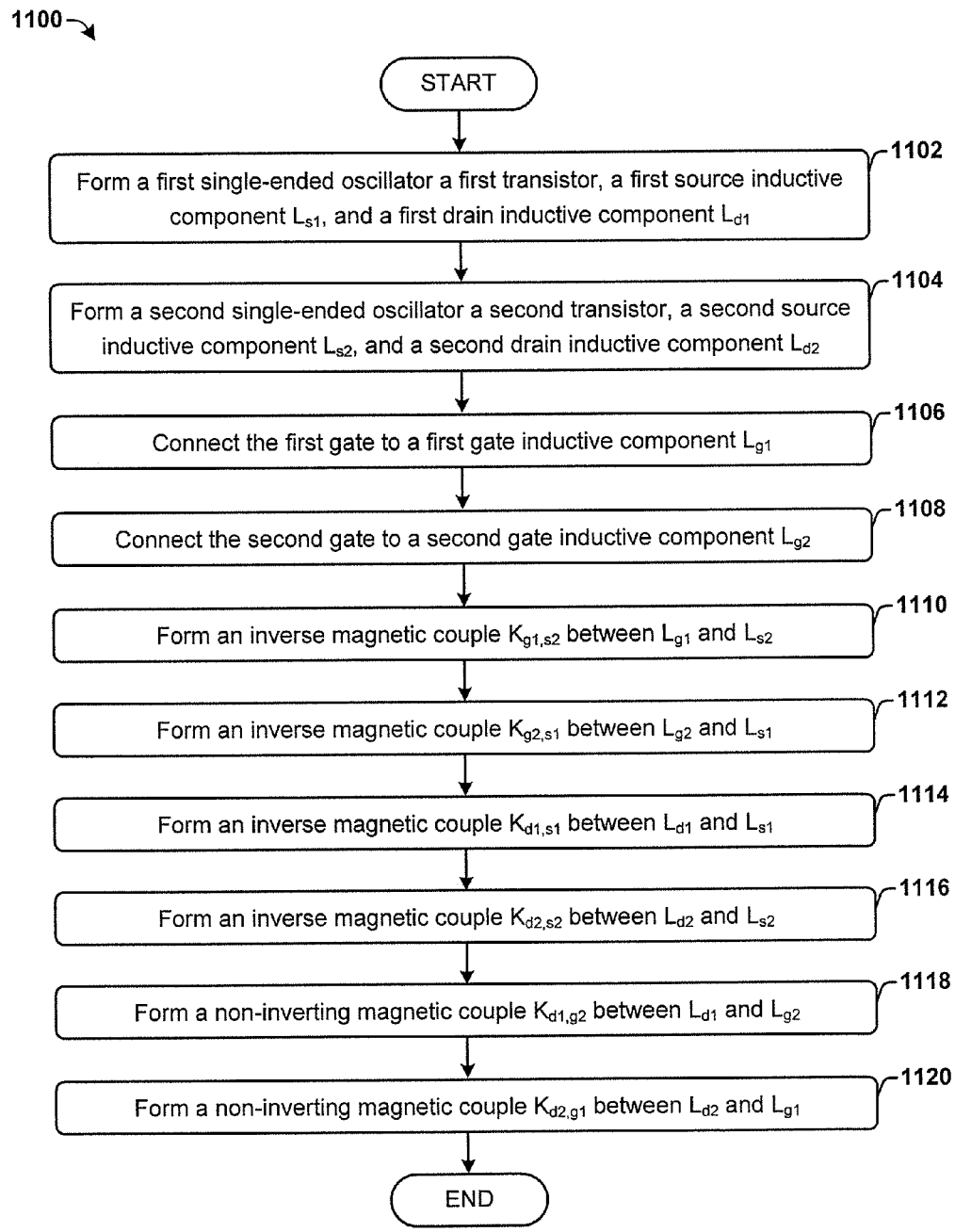
FIG. 11 illustrates some embodiments of a method to form a VCO in accordance with the embodiments of FIG. 2.
Figure 12:
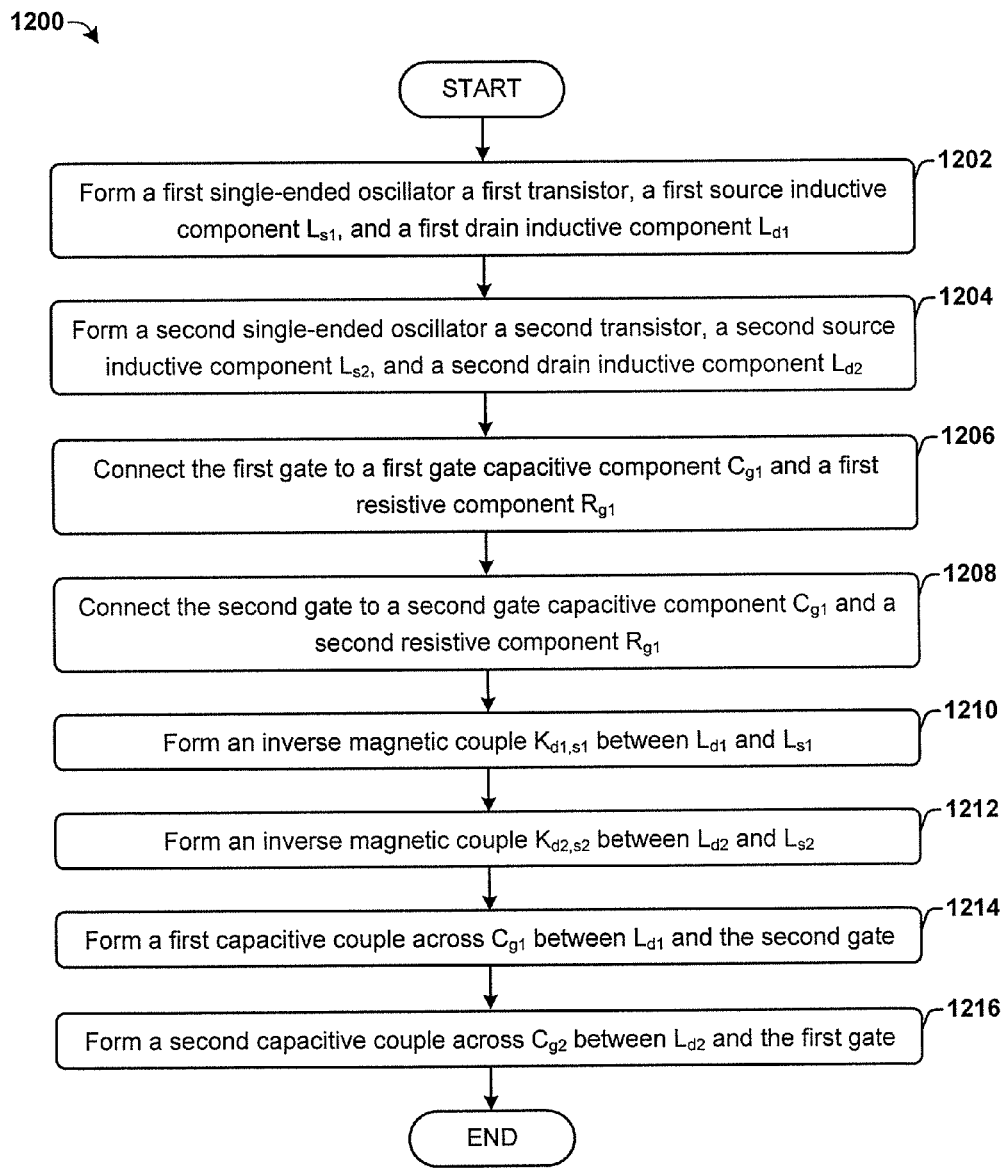
FIG. 12 illustrates some embodiments of a method to form a VCO in accordance with the embodiments of FIG. 6.

FIGS. 11-12 illustrate some embodiments of methods 1100 and 1200, respectively, to form a VCO. While methods 1100 and 1200 are illustrated and described below as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

FIG. 11 illustrates some embodiments of a method 1100 to form a VCO in accordance with the embodiments of FIG. 2.

At 1102 first single-ended oscillator comprising a first transistor, a first source inductive component connected to a first source of the first transistor, and a first drain inductive component connected to a first drain of the first transistor is formed, wherein the first drain inductive component is connected to a supply voltage, and wherein the first source inductive component is connected to ground.

At 1104 a second single-ended oscillator comprising a second transistor, a second source inductive component connected to a second source of the second transistor, and a second drain inductive component connected to a second drain of the second transistor is formed, wherein the second drain inductive component is connected to the supply voltage, and wherein the second source inductive component connected to ground.

At 1106 a first gate of the first transistor is connected to a first gate inductive component, the first gate inductive component comprising an inductor, a transformer, a transmission line, or coupled lines (e.g., coupled metallization lines or conductive lines of another type), or a combination thereof, wherein the first gate inductive component is connected to a gate bias voltage.

At 1108 a second gate of the second transistor is connected to a second gate inductive component, the second gate inductive component comprising an inductor, a transformer, a transmission line, or coupled lines, or a combination thereof, wherein the second gate inductive component is connected to the gate bias voltage.

At 1110 a first electromagnetic couple is formed between the first gate inductive component and the second source inductive component, wherein the first electromagnetic couple comprises an inverse magnetic couple.

At 1112 a second electromagnetic couple is formed between the second gate inductive component and the first source inductive component, wherein the second electromagnetic couple comprises an inverse magnetic couple.

At 1114 a third electromagnetic couple is formed between the first drain inductive component and the first source inductive component, wherein the third electromagnetic couple comprises an inverse magnetic couple.

At 1116 a fourth electromagnetic couple is formed between the second drain inductive component and the second source inductive component, wherein the fourth electromagnetic couple comprises an inverse magnetic couple.

At 1118 a fifth electromagnetic couple is formed between the first drain inductive component and the second gate component, wherein the fifth electromagnetic couple comprises a non-inverting magnetic couple.

At 1120 a sixth electromagnetic couple is formed between the second drain inductive component and the first gate component, wherein the sixth electromagnetic couple comprises a non-inverting magnetic couple.

FIG. 12 illustrates some embodiments of a method 1200 to form a VCO in accordance with the embodiments of FIG. 6.

At 1202 first single-ended oscillator comprising a first transistor, a first source inductive component connected to a first source of the first transistor, and a first drain inductive component connected to a first drain of the first transistor is formed, wherein the first drain inductive component is connected to a supply voltage, and wherein the first source inductive component is connected to ground.

At 1204 a second single-ended oscillator comprising a second transistor, a second source inductive component connected to a second source of the second transistor, and a second drain inductive component connected to a second drain of the second transistor is formed, wherein the second drain inductive component is connected to the supply voltage, and wherein the second source inductive component connected to ground.

At 1206 a first gate of the first transistor is connected to a first gate component, wherein the first gate component comprises a first capacitive component configured in series with a first resistive component, wherein a first node of the first resistive component is connected to a gate bias voltage and a first node of the first capacitive component is connected to the second drain, and wherein the first gate is connected between a second node of the first resistive component and a second node of the first capacitive component.

At 1208 a second gate of the second transistor is connected to a second gate component, wherein the second gate component comprises a second capacitive component configured in series with a second resistive component, wherein a third node of the second resistive component is connected to the gate bias voltage and a third node of the second capacitive component is connected to the first drain, and wherein the second gate is connected between a fourth node of the first resistive component and a fourth node of the first capacitive component.

At 1210 a first electromagnetic couple is formed between the first drain inductive component and the first source inductive component, wherein the first electromagnetic couple comprises an inverse magnetic couple.

At 1312 a second electromagnetic couple is formed between the second drain inductive component and the second source inductive component, wherein the second electromagnetic couple comprises an inverse magnetic couple.

At 1214 a third electromagnetic couple is formed between the first drain inductive component and the second gate component, wherein the third electromagnetic couple comprises a first capacitive couple across the first capacitive component.

At 1216 a fourth electromagnetic couple is formed between the second drain inductive component and the first gate component, wherein the fourth electromagnetic couple comprises a second capacitive couple across the second capacitive component.

It will also be appreciated that equivalent alterations and/or modifications may occur to one of ordinary skill in the art based upon a reading and/or understanding of the specification and annexed drawings. The disclosure herein includes all such modifications and alterations and is generally not intended to be limited thereby. In addition, while a particular feature or aspect may have been disclosed with respect to only one of several implementations, such feature or aspect may be combined with one or more other features and/or aspects of other implementations as may be desired. Furthermore, to the extent that the terms "includes", "having", "has", "with", and/or variants thereof are used herein; such terms are intended to be inclusive in meaning—like "comprising." Also, "exemplary" is merely meant to mean an example, rather than the best. It is also to be appreciated that features, layers and/or elements depicted herein are illustrated with particular dimensions and/or orientations relative to one another for purposes of simplicity and ease of understanding, and that the actual dimensions and/or orientations may differ substantially from that illustrated herein.

Therefore, the present disclosure relates to a device and method to reduce power consumption within a VCO by utilizing trifilar coupling or transformer feedback with a capacitive coupling technique. In some embodiments of trifilar coupling, a VCO is comprised of cross-coupled single-ended oscillators, wherein the bias voltage of first gate within a first single-ended oscillator is separated from the bias voltage of a second drain within a second single-ended oscillator within the cross-coupled pair. A trifilar coupling network within the VCO is composed of a drain inductive component, a source inductive component, and a gate inductive component for a single-ended oscillator, wherein a coupling between drain inductive components and gate inductive components along with a negative feedback loop within each single-ended oscillator forms a cross-coupled pair of transistors which reduces the $V_{ds}$ headroom to approximately a saturation voltage of a transistor within the cross-coupled pair. Compared to some prior art approaches which require $V_{ds}$ voltage headroom of approximately the threshold voltage of a transistor within the cross-coupled pair, the present disclosure provides a $V_{ds}$ voltage headroom of approximately half the threshold voltage. Additionally, in some embodiments the ultra-low voltage VCO of the present disclosure reduces overall chip area due to a smaller transformance within the ultra-low voltage VCO. Moreover, performance metrics such as DC power consumption, oscillation frequency, and phase noise exhibit enhancements over some prior art approaches for a minimum supply voltage approximately 0.22 V, wherein approximately a 5% overall performance enhancement over the some prior art VCOs is realized.

In some embodiments, a device and method of forming a voltage-controlled oscillator comprising a trifilar network is disclosed, the voltage-controlled oscillator comprising a first transistor further comprising a first source connected to a first source inductive component, a first drain connected to a first drain inductive component, and a first gate connected to a first gate inductive component. The voltage-controlled oscillator further comprises a second transistor comprising a second source connected to a second source inductive component, a second drain connected to a second drain inductive component, and a second gate connected to a second gate inductive component. An inverse magnetic couple is formed between the first gate inductive component and the second source inductive component, as well as between the second gate inductive component and the first source inductive component. Additional couplings within the voltage-controlled oscillator include an inverse magnetic couple between the first drain inductive component and the first source inductive component, an inverse magnetic couple between the second drain inductive component and the second source inductive component, non-inverting magnetic couple between the first drain inductive component and the second gate inductive component, and non-inverting magnetic couple between the second drain inductive component and the first gate inductive component. These couplings comprise a trifilar coupling network within the voltage-controlled oscillator. In addition to the DC de-coupling which separates gate and drain node DC biasing, the drain-source voltage headroom of the first and second transistors can be lowered to a saturation voltage so that the voltage-controlled oscillator can operated at sub-threshold voltage.

In some embodiments, a device and method of forming a voltage-controlled oscillator comprising transformer feedback with capacitor coupling is disclosed, the voltage-controlled oscillator comprising a first transistor further comprising a first source connected to a first source inductive component, a first drain connected to a first drain inductive component, and a first gate connected to a first gate component. The voltage-controlled oscillator further comprises a second transistor comprising a second source connected to a second source inductive component, a second drain connected to a second drain inductive component, and a second gate connected to a second gate component. The first gate component comprises a first capacitive component configured in series with a first resistive component, wherein the first resistive component is connected to a gate bias voltage and the first capacitive component is connected to the second drain, and wherein the first gate is connected between the first resistive component and the first capacitive component. The second gate component comprises a second capacitive component configured in series with a second resistive component, wherein the second resistive component is connected to the gate bias voltage and the second capacitive component is connected to the first drain, and wherein the second gate is connected between the second resistive component and the second capacitive component. A first inverted magnetic couple is formed between the first drain inductive component and the first source inductive component, and a second inverted magnetic couple is formed between the second drain inductive component and the second source inductive component. A signal within the voltage-controlled oscillator is coupled by the capacitive components, and blocked by the resistive components, maintaining the oscillation in addition to the DC de-coupling which separates gate and drain node DC biasing, and lowers the drain-source voltage headroom of the first and second transistors to a saturation voltage so that the voltage-controlled oscillator can operated at sub-threshold voltage.

What is claimed is:

1. A voltage-controlled oscillator, comprising:
   a first transistor comprising:
      a first source connected to a first source inductive component; and
      a first drain connected to a first drain inductive component;
      a first gate connected to a first gate inductive component; and
   a second transistor comprising:
      a second source connected to a second source inductive component;
      a second drain connected to a second drain inductive component; and
      a second gate connected to a second gate inductive component;
   wherein a first magnetic couple is formed between the first gate inductive component and the second source inductive component, which maintains in phase voltage signals at the first gate inductive component and at the second source inductive component; and
   wherein a second inverse magnetic couple is formed between the second gate inductive component and the first source inductive component, which maintains in phase voltage signals at the second gate inductive component and at the first source inductive component.

2. The voltage-controlled oscillator of claim 1,
   wherein the first drain inductive component is connected to a supply voltage;
   wherein the second drain inductive component is connected to the supply voltage;
   wherein the first gate inductive component is connected to a gate bias voltage;
   wherein the second gate inductive component is connected to the gate bias voltage;
   wherein the first source inductive component is connected to ground; and
   wherein the second source inductive component is connected to ground.

3. The voltage-controlled oscillator of claim 1,
   wherein a third inverse magnetic couple is formed between the first drain inductive component and the first source inductive component;
   wherein a fourth inverse magnetic couple is formed between the second drain inductive component and the second source inductive component;
   wherein a fifth non-inverting magnetic couple is formed between the first drain inductive component and the second gate inductive component; and
   wherein a sixth non-inverting magnetic couple is formed between the second drain inductive component and the first gate inductive component.

4. The voltage-controlled oscillator of claim 1, wherein the first or second source inductive component, the first or second drain inductive component, or the first or second gate inductive component, comprises an inductor, a transformer, a transmission line, or coupled lines comprising one or more metallization layers.

5. The voltage-controlled oscillator of claim 1, wherein the first gate inductive component is connected to a first terminal of a capacitor and the second gate inductive component is connected to a second terminal of the capacitor, such that the first and second gate inductive components are directly coupled through the capacitor.

6. A voltage-controlled oscillator, comprising:
a first single-ended oscillator comprising a first transistor, a first source inductive component connected to a first source of the first transistor, and a first drain inductive component connected to a first drain of the first transistor;
a second single-ended oscillator comprising a second transistor, a second source inductive component connected to a second source of the second transistor, and a second drain inductive component connected to a second drain of the second transistor;
a first gate of the first transistor connected to a first gate inductive component;
a second gate of the second transistor connected to a second gate inductive component;
wherein a first inverse magnetic couple is formed between the first gate inductive component and the second source inductive component, which maintains in phase voltage signals at the first gate inductive component and at the second source inductive component; and
wherein a second inverse magnetic couple is formed between the second gate inductive component and the first source inductive component, which maintains in phase voltage signals at the second gate inductive component and at the first source inductive component.

7. The voltage-controlled oscillator of claim 6,
wherein the first drain inductive component is connected to a supply voltage, the first gate inductive component is connected to a gate bias voltage, and the first source inductive component is connected to ground; and
wherein the second drain inductive component is connected to the supply voltage, the second gate inductive component is connected to the gate bias voltage, and the second source inductive component connected to ground.

8. The voltage-controlled oscillator of claim 6,
wherein the first gate inductive component is connected to a first terminal of a capacitor; and
wherein the second gate inductive component is connected to a second terminal of the capacitor.

9. A voltage-controlled oscillator (VCO), comprising a plurality of VCO cells, wherein a VCO cell of the plurality of VCO cells comprises:
a first transistor comprising:
a first source connected to a first source inductive component;
a first drain connected to a first drain inductive component;
a first gate connected to a first gate inductive component; and
a second transistor comprising:
a second source connected to a second source inductive component;
a second drain connected to a second drain inductive component; and
a second gate connected to a second gate inductive component;
wherein the first and second drain inductive components are connected to a supply voltage, the first and second gate inductive components are connected to a gate bias voltage, and the first and second source inductive components are connected to ground; and
wherein first and second inter-cell electromagnetic couples are formed between the first and second drain inductive component of a first VCO cell and the first and second source inductive components of a second VCO cell, respectively.

10. The VCO of claim 9, wherein a third inter-cell electromagnetic couple is formed between the first source inductive component of the first VCO cell and the second drain inductive component of the second VCO cell.

11. The VCO of claim 10, wherein a fourth inter-cell electromagnetic couple is formed between the second source inductive component of the first VCO cell and the first drain inductive component of the second VCO cell.

12. The VCO of claim 9, wherein a fifth inter-cell electromagnetic couple is formed between the first drain inductive component of the second VCO cell and the first source inductive component of a third VCO cell.

13. The VCO of claim 12, wherein a sixth inter-cell electromagnetic couple is formed between the second drain inductive component of the second VCO cell and the second source inductive component of the third VCO cell.

14. The VCO of claim 13, wherein a seventh inter-cell electromagnetic couple is formed between the first drain inductive component of the third VCO cell and the first source inductive component of a fourth VCO cell.

15. The VCO of claim 14, wherein an eighth inter-cell electromagnetic couple is formed between the second drain inductive component of the third VCO cell and the second source inductive component of the fourth VCO cell.

16. The VCO of claim 15, wherein a ninth inter-cell electromagnetic couple is formed between the first drain inductive component of the fourth VCO cell and the second source inductive component of the first VCO cell.

17. The VCO of claim 16, wherein a tenth inter-cell electromagnetic couple is formed between the second drain inductive component of the fourth VCO cell and the first source inductive component of the first VCO cell.

18. The VCO of claim 9,
wherein a first intra-cell electromagnetic couple is formed within one or more of the plurality of VCO cells between the first gate inductive component and the second source inductive component; and
wherein a second intra-cell electromagnetic couple is formed within one or more of the plurality of VCO cells between the second gate inductive component and the first source inductive component;
wherein a third intra-cell electromagnetic couple is formed within one or more of the plurality of VCO cells between the first drain inductive component and the first source inductive component;
wherein a fourth intra-cell electromagnetic couple is formed within one or more of the plurality of VCO cells between the second drain inductive component and the second source inductive component;
wherein a fifth intra-cell electromagnetic couple is formed within one or more of the plurality of VCO cells between the first drain inductive component and the second gate inductive component; and
wherein a sixth intra-cell electromagnetic couple is formed within one or more of the plurality of VCO cells between the second drain inductive component and the first gate inductive component.

19. The VCO of claim 18,
wherein the first intra-cell electromagnetic couple, the second intra-cell electromagnetic couple, the third intra-cell electromagnetic couple, and the intra-cell fourth electromagnetic couple comprise an inverse magnetic couple; and wherein the fifth intra-cell electromagnetic couple and the sixth intra-cell electromagnetic couple comprise a non-inverting magnetic couple.

20. The VCO of claim 9, wherein the first or second source inductive component, the first or second drain inductive component, or the first or second gate inductive component, comprises an inductor, a transformer, a transmission line, or coupled lines comprising one or more metallization layers.

* * * * *